United States Patent [19]

Donegan et al.

[11] Patent Number: 5,761,028
[45] Date of Patent: Jun. 2, 1998

[54] TRANSISTOR CONNECTION ASSEMBLY HAVING IGBT (X) CROSS TIES

[75] Inventors: Kevin J. Donegan, Merrimack, N.H.; Dennis E. Hartzell, Wertogue; Gary P. Millas, Avon, both of Conn.

[73] Assignee: Chrysler Corporation, Auburn Hills, Mich.

[21] Appl. No.: 642,083

[22] Filed: May 2, 1996

[51] Int. Cl.⁶ .................................................. H01L 29/41
[52] U.S. Cl. .................... 361/679; 257/735; 257/776; 257/775; 257/773; 174/68.1
[58] Field of Search ................. 174/68.1; 257/773, 257/775, 776, 735; 361/679, 728, 729

[56] References Cited

U.S. PATENT DOCUMENTS

| | | | |
|---|---|---|---|
| 3,457,639 | 7/1969 | Weller | 430/22 |
| 3,539,705 | 11/1970 | Nathanson | 257/776 |
| 3,560,808 | 2/1971 | Segerson | 257/776 |
| 3,673,016 | 6/1972 | Gerstner | 257/735 |
| 3,681,134 | 8/1972 | Nathanson | 257/776 |
| 3,916,433 | 10/1975 | Schierz | 257/735 |
| 3,961,350 | 6/1976 | Tiefert | 257/773 |
| 4,275,410 | 6/1981 | Grinberg | 257/774 |
| 4,444,285 | 4/1984 | Stewart et al. | 180/65.4 |
| 4,495,451 | 1/1985 | Barnard | 180/65.4 |
| 4,533,011 | 8/1985 | Heidemeyer et al. | 180/65.2 |
| 4,631,456 | 12/1986 | Drescher et al. | 318/140 |
| 4,900,962 | 2/1990 | Hockney et al. | 310/90.5 |
| 4,961,352 | 10/1990 | Downer et al. | 74/5.46 |
| 4,996,582 | 2/1991 | Nagahama | 257/735 |
| 4,996,583 | 2/1991 | Hatada | 257/735 |
| 5,014,110 | 5/1991 | Satoh | 257/776 |
| 5,172,784 | 12/1992 | Varela, Jr. | 180/65.4 |
| 5,255,733 | 10/1993 | King | 180/65.3 |
| 5,291,975 | 3/1994 | Johnson et al. | 188/378 |
| 5,318,142 | 6/1994 | Bates et al. | 180/65.2 |
| 5,319,273 | 6/1994 | Hockney et al. | 310/90.5 |
| 5,327,987 | 7/1994 | Abdelmalek | 180/65.1 |
| 5,345,761 | 9/1994 | King et al. | 180/65.3 |
| 5,353,656 | 10/1994 | Hawkey et al. | 74/5.7 |
| 5,396,140 | 3/1995 | Goldie et al. | 310/261 |
| 5,442,288 | 8/1995 | Fenn et al. | 324/244 |
| 5,465,015 | 11/1995 | Anastas et al. | 310/26 |
| 5,528,060 | 6/1996 | Bayraktaroglu | 257/773 |
| 5,530,282 | 6/1996 | Tsuji | 257/735 |

OTHER PUBLICATIONS

Popular Science Magazine, Emerging Technologies for the Supercar, Jun. 1994.

NASA Tech Briefs, The Digest of New Technology, Jun. 1995, vol. 19, No. 6, pp. 12 and 13.

*Primary Examiner*—William M. Shoop, Jr.
*Assistant Examiner*—Peter Ganjian
*Attorney, Agent, or Firm*—Mark P. Calcaterra

[57] ABSTRACT

A hybrid vehicle includes a power unit communicating power between a turbine alternator, flywheel and traction motor. The power unit stores DC power in capacitors and places the power on DC bus for use in driving the induction machines. Power transistors receive the DC power from the DC bus and are pulse width modulated to output a synthesized AC waveform at their output. A transistor connection assembly comprising the plurality of power transistor modules connected in a plane and each having contact pads formed thereon for providing an output signal. A cross tie member is connected to four of the contact pads providing a combined output signal at a center point. The cross tie member comprises a sheet of rigid conducting material with width substantially greater than thickness and including four symmetrical arms extending outward from the center point. The design provides equal distance conduction paths for equal current sharing.

9 Claims, 9 Drawing Sheets

TRANSISTOR CONNECTION ASSEMBLY HAVING IGBT (X) CROSS TIES

BACKGROUND OF THE INVENTION

1. Field of the Invention

The present invention relates generally to powertrain systems in vehicles, and, more particularly, to a hybrid powertrain system in an automotive vehicle.

2. Description of the Related Art

Since the invention of power vehicles, many different powertrain systems have been attempted, including a steam engine with a boiler or an electric motor with a storage battery. It was, however, the four-stroke internal combustion engine invented by Otto in 1876, and the discovery of petroleum in 1856 that provided the impetus for the modern automotive industry.

Although gasoline emerged as the fuel of choice for automotive vehicles, recent concerns regarding fuel availability and increasingly stringent federal and state emission regulations have renewed interest in alternative fuel powered vehicles. For example, alternative fuel vehicles may be powered by methanol, ethanol, natural gas, electricity or a combination of fuels.

A dedicated electric powered vehicle offers several advantages: electricity is readily available; an electric power distribution system is already in place; and an electric powered vehicle produces virtually zero emissions. There are several technological disadvantages that must be overcome before electric powered vehicles gain acceptance in the marketplace. For instance, the range of present electric powered vehicles is limited to approximately 100 miles, compared to about 300 miles for a gasoline powered vehicle. Further, the acceleration is about half that of a similar gasoline power vehicle. There is, therefore, a need in the art for a powertrain to provide an electric motor for an automotive vehicle which is capable of performing as dynamically as an internal combustion engine.

SUMMARY OF THE INVENTION

An object of the invention is that the across ties form a part of the emitter/controller AC bus structure and provide uniform current distribution while minimizing parasitic inductance.

Another object is that the construction reduces over voltage transients and therefore the amount of DC bus capacitance needed to regulate the bus.

The invention includes a transistor connection assembly comprising a plurality of power transistor modules connected in a plane and each having contact pads formed thereon for providing an output signal. A cross tie member is connected to four of the contact pads providing a combined output signal at a center point. The cross tie member comprises a sheet of rigid conducting material with width substantially greater than thickness and including four symmetrical arms extending outward from the center point.

Other objects, features and advantages of the present invention will be readily appreciated as the same becomes better understood after reading the subsequent description taken in conjunction with the accompanying drawings.

DESCRIPTION OF THE PREFERRED EMBODIMENT(S)

Figure 1:
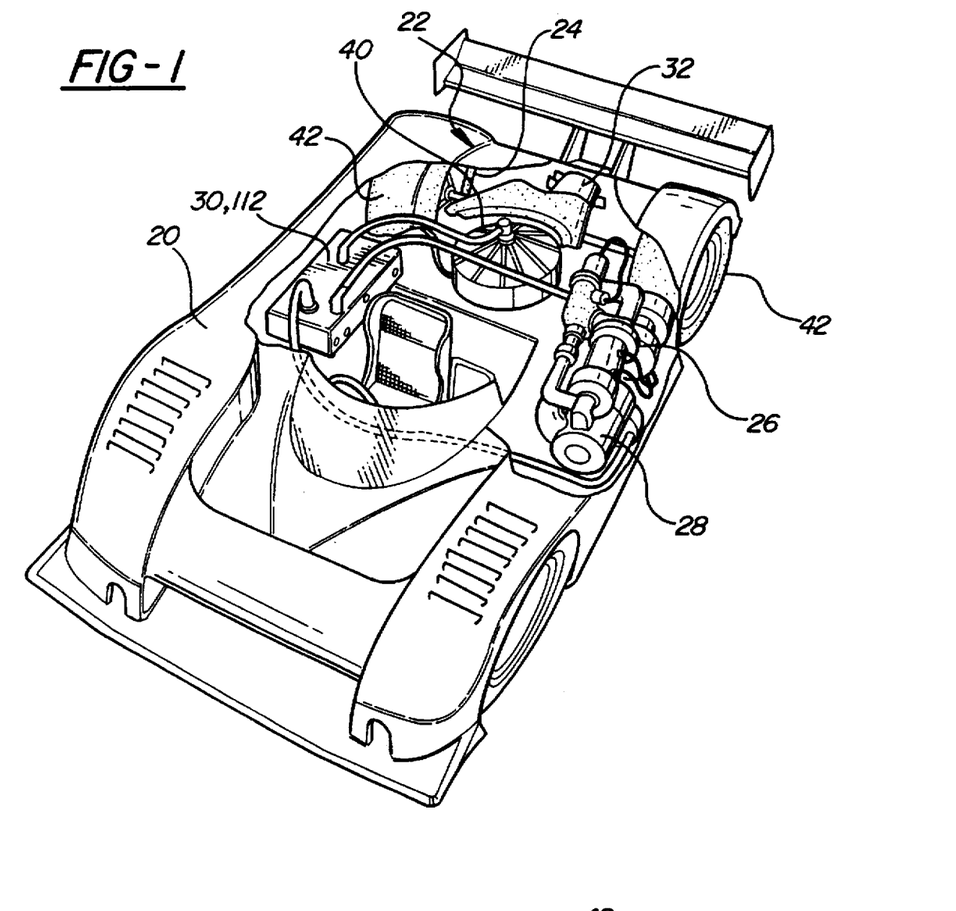
FIG. 1 is a perspective view of a hybrid vehicle.
Figure 2:
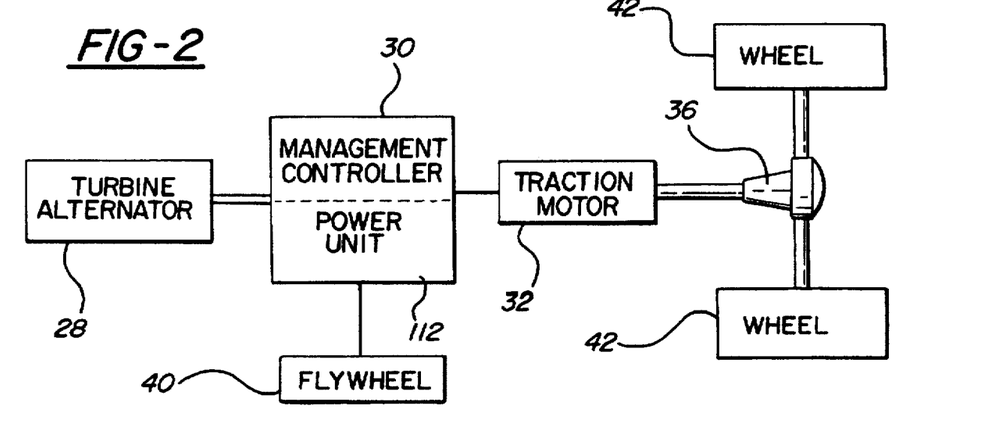
FIG. 2 is a block diagram of a power train for the hybrid vehicle.

Referring to FIGS. 1 and 2, a hybrid powertrain system is illustrated for an automotive vehicle 20. The vehicle 20 is partially shown in a cut away view illustrating a hybrid powertrain system 22 disposed within the chassis 24. The hybrid powertrain system 22 includes a gas powered turbine engine 26, which in this example is fueled by liquefied natural gas. The turbine engine 26 spins an alternator unit 28 to generate electric power. It should be appreciated that in this example there are two alternators in the alternator unit 28 that run at different speeds, such as 60,000 rpm and 100,000 rpm, to produce electricity equivalent to 500 horsepower. A flywheel 40 is provided for energy storage. A traction motor 32 receives power to move the vehicle 20.

A power management controller 30 controls power between the alternator unit 28, turbine engine 26, traction motor 32 and flywheel 40. The management controller 30 is in communication with the turbine engine 26 and alternator unit 28, and manages the distribution of power from the alternator 28 to the traction or induction motor 32 and through a drive train, utilizing a three phase variable frequency alternating current (VFAC). In this example the traction motor 32 is an AC induction motor. The traction motor 32 transfers its energy to the drive train 40 to drive the automotive vehicle 20.

Therefore, when a user requires acceleration of the vehicle 20, a signal is produced and is communicated to the management controller 30. The management controller 30 directs the alternator 28 and if necessary a flywheel 40, to supply power to the traction motor 32 which in turn drives the wheels 42. If the power need of the traction motor 32 is low, the management controller 30 directs the excess power capacity into the flywheel 40 for storage.

The hybrid powertrain system 22 also includes various critically placed sensors which are conventional and well known in the art. The outputs of these sensors communicate with the control system 30. It should also be appreciated that the automotive vehicle 20 includes other hardware not shown, but conventional in the art to cooperate with the hybrid powertrain system 20.

The peripheral machines, comprising the turbine alternator unit 28 and traction motor 32 are all induction machines. The flywheel 40 is a permanent magnet machine. Power in the form of alternating current must be supplied to each electric machine 28,32,40 and may be generated or provided by each electric machine 28,32,40. The management controller 30 manipulates the power to form the necessary signals for each electric machine 28,32,40 (i.e., frequency and magnitude) and provides the necessary magnitude changes.

The system 22 also includes a power unit 112 for converting and storing power and transferring same between the electric machines 28,32,40 based on control signals from the management controller 30.

The power unit 112 can transfer power directly between all of the major electric machines 28,32,40 bidirectionaly with the 800 VDC bus as the medium of exchange. The 800 VDC bus is held constant primarily by absorbing and generating power from and to the flywheel. The DC capacitor bank is used to absorb and generate power for the amount of time needed for the flywheel controller to respond and control the DC bus which is approximately 5 milliseconds. For transients longer than 5 milliseconds a combination of the flywheel and the dump resistor circuit is used. The bidirectional power to the turbo alternators 28 is power that is sent into the alternator 28 from the DC bus through the power transistors to excite the magnetic field required to generate EMF. The resultant power flow is out of the generator and is rectified from AC to DC by the diodes 122 in the transistor modules 120 and coupled back 800 VDC bus.

The bidirectional power flow to the permanent magnet flywheel motor is the power unit 112 acts as a buck regulator (or a step-down regulator) in the motoring mode and a boost regulator (or a step up regulator) in the generator mode since the back EMF of the flywheel motor is fixed proportionally to the flywheel speed. The combination of the flywheel motor system and DC capacitor bank form an electromechanical battery or energy accumulator. A low power external 800 VDC is connected to the power management system and is used to slow charge the electomechanical battery by storing energy in the flywheel by slowly increasing the flywheel speed.

The gas turbine engine is started by transferring energy from the flywheel to through the power unit to the alternators which are now used as a inductive drive motor machine to start the turbines. The management controller 30 manipulates and controls the power unit 112 to selectively transfer the power based on various operating conditions of the vehicle, and to synthesize a sinusoidal current waveform to operate the electric machines 28,32,40 at the desired levels. Alternating current waveforms are constructed from DC stored signals. For example, the power unit 112 stores DC voltage at a nominal 800 V. The turbine alternator unit 28 requires ac power signals at 1500–2 kHz, the flywheel requires AC power signals up to 10 kHz, and the traction motor 32 requires AC power signals at 600–700 Hz.

Figure 3:
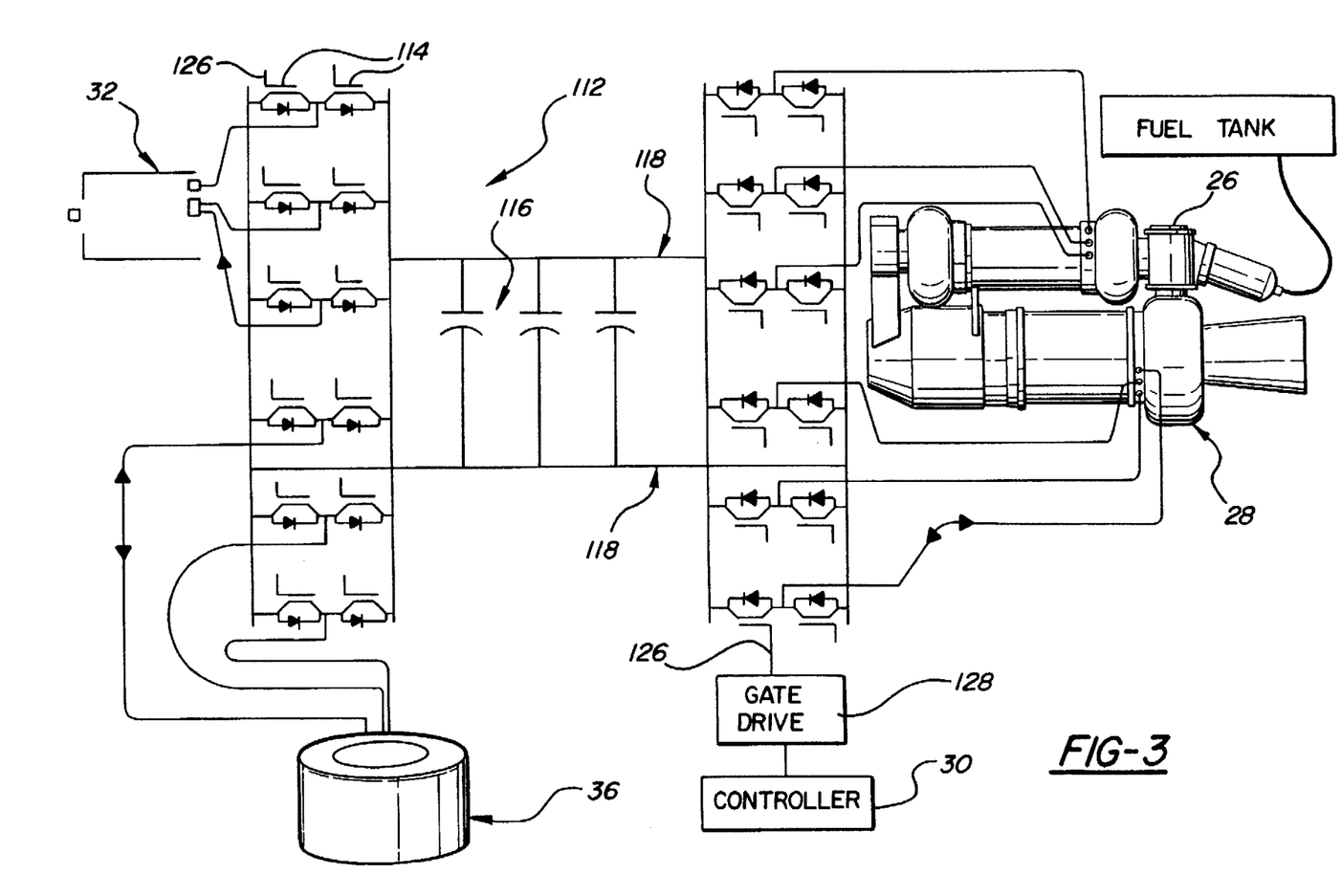
FIG. 3 is a schematic view of the power unit in the vehicle.

A schematic diagram of the power unit 112 is generally illustrated in FIG. 3. As illustrated, the power unit 112 includes a plurality of power switches in the form of power transistors 114 connected between the electric machines 28,32,40 and a DC energy storage assembly in the form of a capacitor bank 116. The power transistors 114 switch power to each of the electric machines 28,32,40 from the capacitor bank 116, and also switch power from these machines to the capacitor bank 116. The capacitor bank 116 stores pulsating DC voltage levels at a nominal 800 volts (+\−50 V.). Connected between the capacitor bank 116 and the power transistors 114 is a DC bus 118 which communicates the DC power stored in the capacitor banks 116 to and from the power transistors 114. As subsequently discussed, the gates of the power transistors 114 are controlled such that synthesized AC power signals are sent to each of the electric machines 28,32,40 through pulse width modulation. In turn, AC power which is produced by the alternator unit 28 is rectified by the diodes mounted with power transistors 114 and is supplied to the capacitor bank 116 via the DC bus 118.

The power transistors 114 are comprised of a plurality of insulated gate bipolar transistors (IGBT) which, as commonly known in the art, are a hybrid between a bipolar transistor and a MOSFET wherein an insulated gate receives a voltage controlled signal which controls a large output current flowing through the transistor 114. The transistors 114 are part of a transistor module 120 illustrated in FIG. 5a.

Figures 4A, 4B:
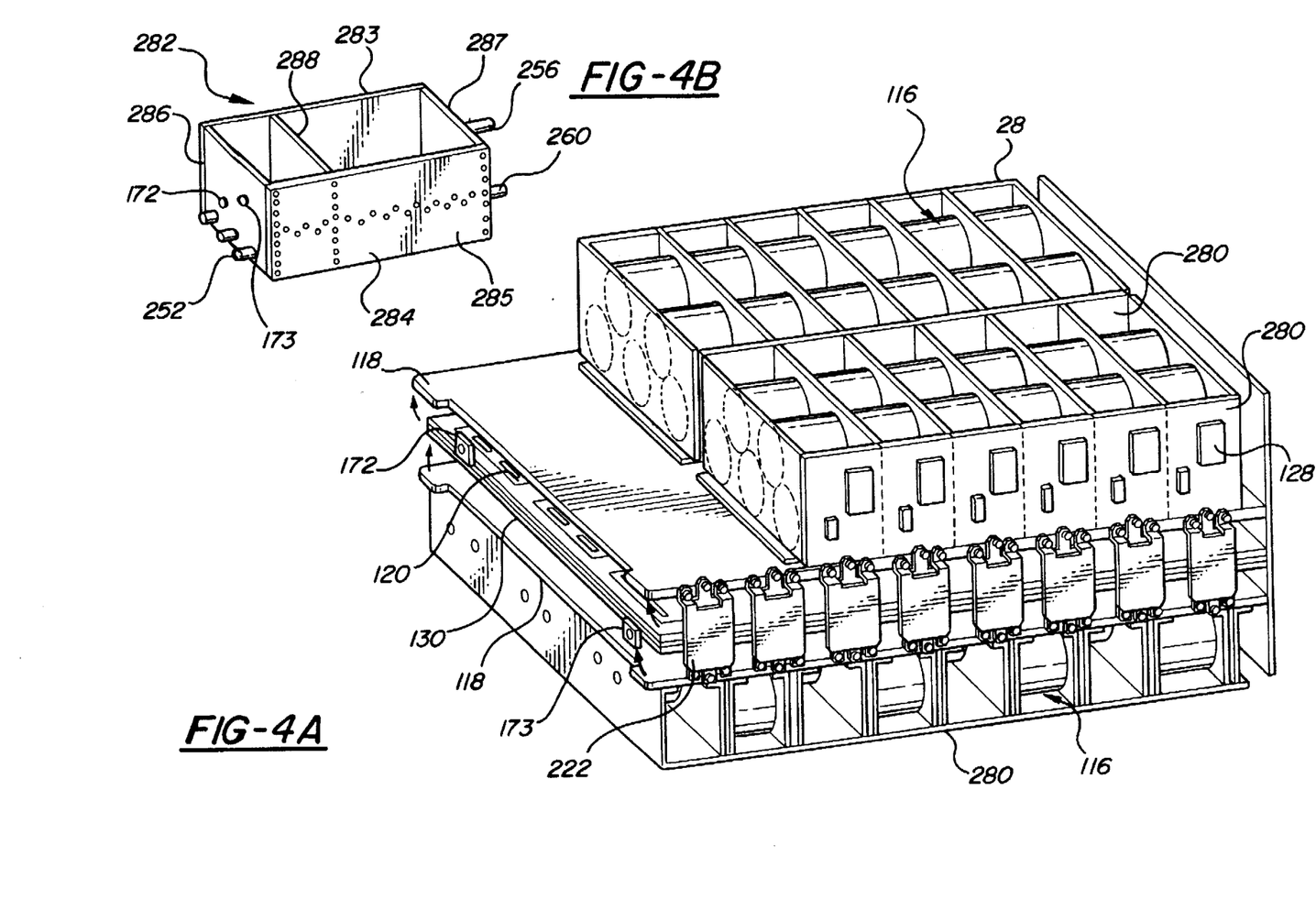
FIG. 4A is a perspective view of the power unit.
FIG. 4B is a perspective view of a housing for the power unit.

Referring to FIG. 4A, each transistor module 120 is comprised of six separate transistors 114 and twelve diodes 122 connected on a common board forming the module 120. The numerous transistors 114 and diodes 122 are utilized to share the high current flowing through the power unit 112. The transistors 114 are each connected to a free wheeling diode 122 across their collector/emitter. A dampening resistor 123 is connected to the gate 126. The transistors 114 are connected in an H-bridge configuration to allow the production of three-phase AC signals. The H-bridge is comprised of six transistor modules 120 connected as illustrated in FIG. 3. In this arrangement, pairs of transistor modules 120 forming one phase have a common emitter and collector providing or receiving the AC signal at their common collector/emitter point, whereas the other of the emitter and collector of the pair are connected to opposite polarities of the DC bus 118. Therefore, there are three pairs of transistor modules 120 producing the three-phase output signal. The gates 126 of the transistors 114 are connected to a gate drive assemblies 128, as subsequently discussed. The gate drive assemblies 128 pulse width modulate the transistors 114 to synthesize the AC waveform by switching the pairs on and off.

The traction motor 32 utilizes eighteen (18) transistor modules 120, the flywheel 40 utilizes twelve (12) transistor modules 120, and the alternator unit 28 utilizes twelve (12) transistor modules 120 (six for each alternator).

The transistor modules 120 are connected to a fluid cooled cold-plate, which will be referred to as the heat exchanger assembly 130. The direct connection between the transistor modules 120 and the heat exchanger assembly 130 provide optimal cooling of the transistors 114 due to the switching and current considerations of the transistor modules 120.

Figure 5A:
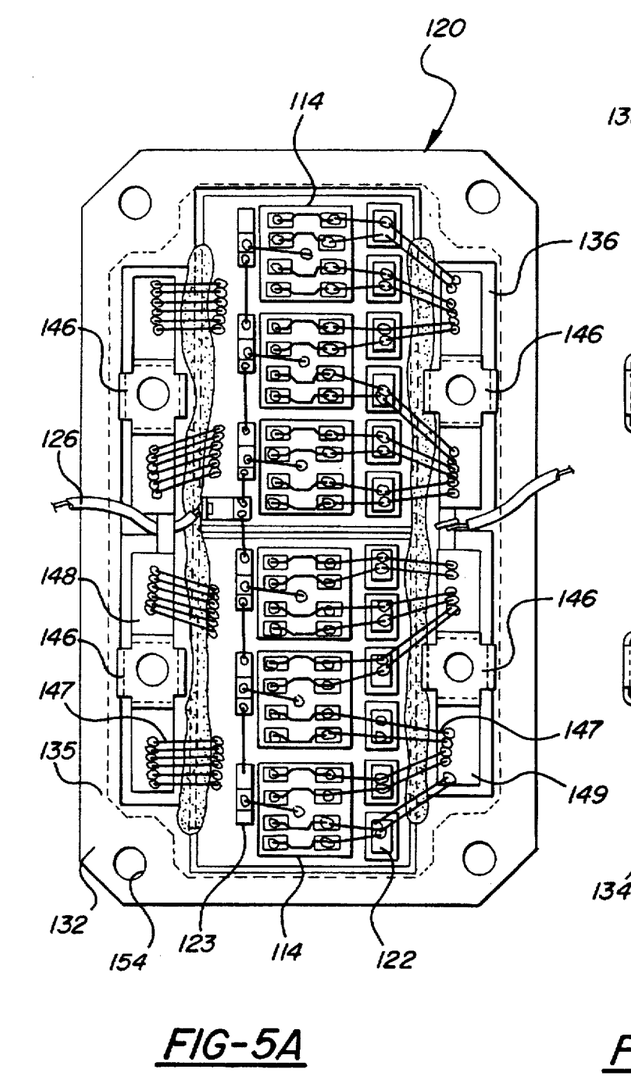
FIG. 5a is a plan view of a transistor module.
Figure 5B:
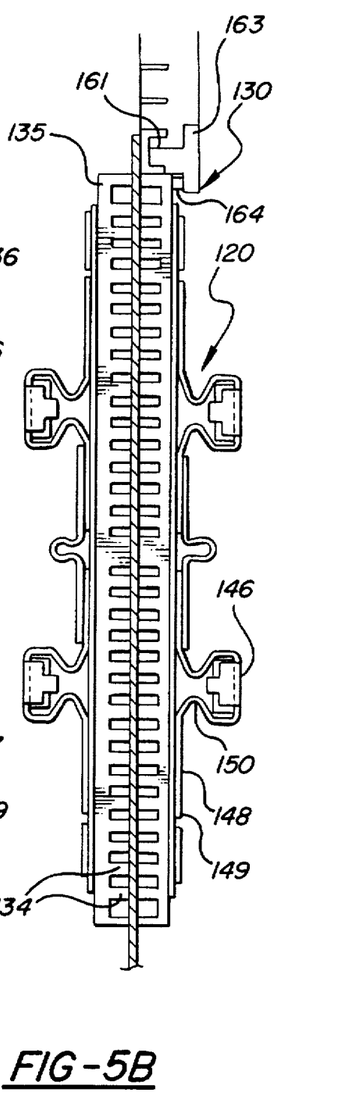
FIG. 5b is a side view of a transistor module.

The transistor modules 120 include a support plate 132 which is in direct contact with the cooling fluid of the heat exchanger assembly 130. The plate 132 is generally rectangular in shape and includes a plurality of cooling fins 134 extending from an outward surface thereof. The fins 134 extend longitudinally across the surface in the direction of coolant flow across the module 120 i.e., same direction of power flow through the module 120. The fins 134 provide turbulent flow through the exchanger 130 of the fluid with modest pressure drop but high thermal transfer characteristics. An opposing supporting surface 135 supports the transistors 114 in thermal contact therewith. The support plate 132 is preferably made of silicon carbide to enhance cooling conduction and to obtain a thermal coefficient of expansion similar to silicon (that of the transistors 114). The silicon carbide plate 132 is machined or alternatively cast to form the fins 134 and is over plated with gold. An electrical insulation layer 136 is connected by solder to the support plate 132. The insulation layer 136 comprises DBC (direct bond copper) which is formed by a layer of copper, aluminum nitride, and copper heated to melt and fuse the copper to the ceramic substrate. The thermal conductivity is high in this layer 136 (similar to aluminum), and the layer 136 can be soldered at the two outer copper surfaces. As illustrated in FIG. 5a, six separate areas are formed by the insulation layer 36 (two for the transistors 114 and four for the contact pads 146). The integrated circuit chip (silicon) forming the transistors 114 is soldered to the copper surface of the electrical insulation layer 136. Each chip or die 114 represents one transistor operating at 75 Amperes.

The module 114 includes raised contact pad 146 connected to the collectors and emitters of the transistors 114 by suitable wire lead connections 147. The contact pads 146 are formed of ductile copper strips 148 to allow some bending and flexibility thereof for connection. This will provide suitable connection when the connection surfaces are not coplanar within small tolerances with all of the contact pads 146. The strips 148 include a resilient bond 150 therein to allow for the extension and retraction of the contact pads 146 to ensure the required electrical contact. The strips 148 include ends 149 which are soldered to the module 120 on the electrical insulation layer 136. The support plate 132 includes a plurality of fastening apertures 154 extending therethrough for mounting, as subsequently described.

In each transistor module 120, either the collectors or emitters are connected to the DC bus 118 at the contact pads 146 on one side of the module 120. The strips 148 are connected by the wire leads 147 to the electrically conducting DBC layer 136, and the transistor chip 114 contacts the DC signal on its bottom die surface.

Figure 6:
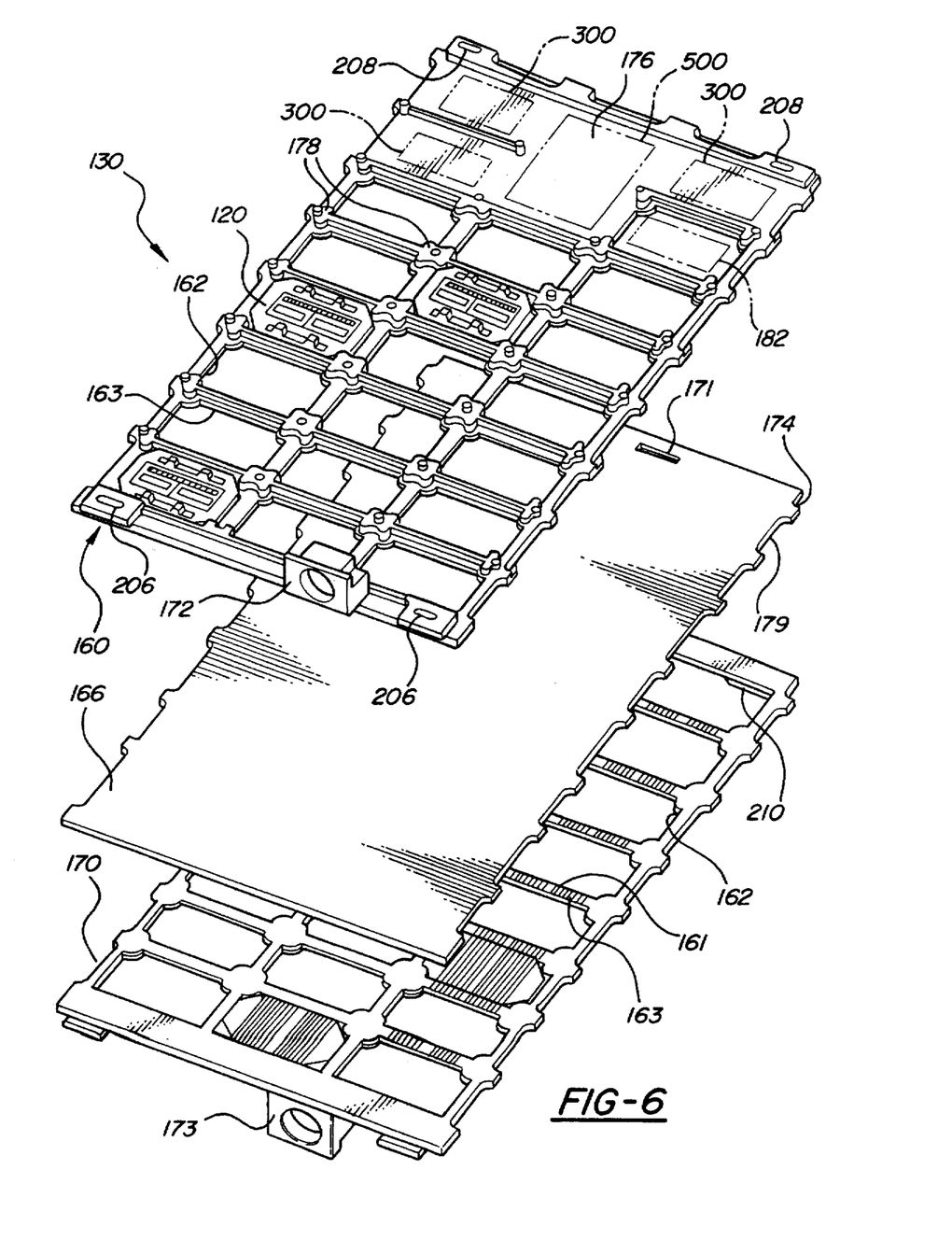
FIG. 6 is an exploded view of the heat exchanger and AC bus.

The heat exchanger assembly 130 provides cooling of the transistor modules 120, along with other components of the power unit 112. The heat exchanger assembly 130 includes a first frame member 160 having a plurality or matrix of open windows 162 therein. The windows 162 receive the transistor modules 120 in sealed connection therewith. A sealing O-ring 164 is placed between the support plate 132 of the transistor modules 120 and the window 162. Frame walls 163 surround the windows 162 and provide a flange to support the O-ring seal 164. The heat exchanger assembly 130 also includes a base plate 166 connected to the first frame member 160 and spaced therefrom establishing a first cavity to allow water to flow between the base plate 166 and the frame member 160. The fluid flowing in the cavity thereby flows through the fins 134 of the transistors modules 114 to aid in cooling thereof. The first frame member 160 also includes fins 161 extending into the cavity which align with the fins 134 of the transistor modules 120. In the preferred embodiment, the heat exchanger 130 also includes a second frame member 170 opposing the first frame member 160 about the base plate 166 and operatively secured with the base plate 166 and the first frame member 160. The second frame member 170 is spaced from the base plate 166 to establish a second cavity therebetween for allowing fluid to flow therethrough. Similarly, fins are provided on the interior surface of the frame.

A fluid inlet 172 is connected to either of the first or second frame members 160,170, and a fluid outlet 173 is secured to the other of the first or second frame members 160,170. In the preferred embodiment, the inlet 172 is connected to the first frame member 160, and the outlet 173 is connected to the second frame member 170. The flow is parallel through the heat exchanger 130. The end of the base plate 166 opposite the inlet 172 and outlet 173 end is provided with are fluid openings 171 to allow fluid to flow from the first cavity to the second cavity. The frame members 160,170 and base plate 166 are generally rectangular in shape. The perimeter of the frame members 160,170 and base plate 166 include a plurality of fastening apertures 174 therethrough for receiving suitable fasteners 175 for connecting the frame members 160,170 and base plate 166 to one another. Furthermore, each of the first and second frame members 160,170 include a plurality of support posts 178 extending outwardly from the cross points of the frame walls 163 between the corners of adjacent windows 162. The support posts 178 are for mounting in the DC bus 118, as discussed subsequently. Also, included are mounting apertures 179 extending into the outer edge of the perimeter wall of the base plate 166 for mounting the heat exchanger 130 to a chassis housing 300, as subsequently discussed.

The windows 162 are formed in a matrix pattern within each of the frame members 160,170. In the preferred embodiment, the matrix is formed by 3×8 windows. The first frame member 160 includes a mounting plate 176 connected in place of five (5) of the windows 162 to allow for mounting and cooling of additional components other than the transistor modules 114. The windows 162 are formed in the remainder of the first frame member 160. All of the matrix is comprised of windows 162 in the second frame member 170.

The transistor modules 120 are mounted to each of the frame members 160 with the contact pads 146 extending outwardly from the heat exchanger assembly 130. Therefore, the transistor modules 120 are loaded from the cavity side of the frame members 160,170 with the O-ring seals 164 therebetween. Fasteners connect the transistor modules 114 to the frame members 160,170. In the preferred embodiment, the second frame member 170 holds twenty-four (24) transistor modules 120, and the first frame member 160 holds eighteen (18) transistors modules 120. A remainder of the windows 162 not filled by a transistor module 120 is utilized for a dump resistor 182, which is used for dumping power over a predetermined limit from the DC bus 118.

The DC bus 118 comprises two DC buses 118a,118b identically formed and each including a positive and negative half. Therefore, the general structure of the DC bus 118 will be described, it being understood that it is applied to both separate buses 118a,118b. The DC bus 118 includes a first conducting plate 190 and a second conducting plate 191. An insulation layer 192 is sandwiched between the two plates 190,191. The plates 190,191 and the insulation layer 192 are laminated to one another forming a thin conducting plane. The first conducting plate 190 forms the positive DC signal and the second conducting plate 91 forms the negative or reference DC signal. Each of the first and second conducting plates 190,191 include fluid passages 194 extending within the plates 190,191 allowing fluid to circulate therein for cooling purposes. Each of the plates 190,191 include a fluid inlet 195 and a fluid outlet 196 extending longitudinally outwardly from opposite ends of the plates 190,191 and along a common side thereof. The bus fluid inlets 195 for both plates 190,191 are both on one end of the buss 118 and the bus fluid outlets 196 are on an opposing end of the bus 118 for allowing coolant or water to be pumped therethrough. The inlet/outlet pair 195,196 on the first plate 190 is on an opposing side from the pair 195,196 of the second plate 191 (see FIG. 7).

Figure 7:
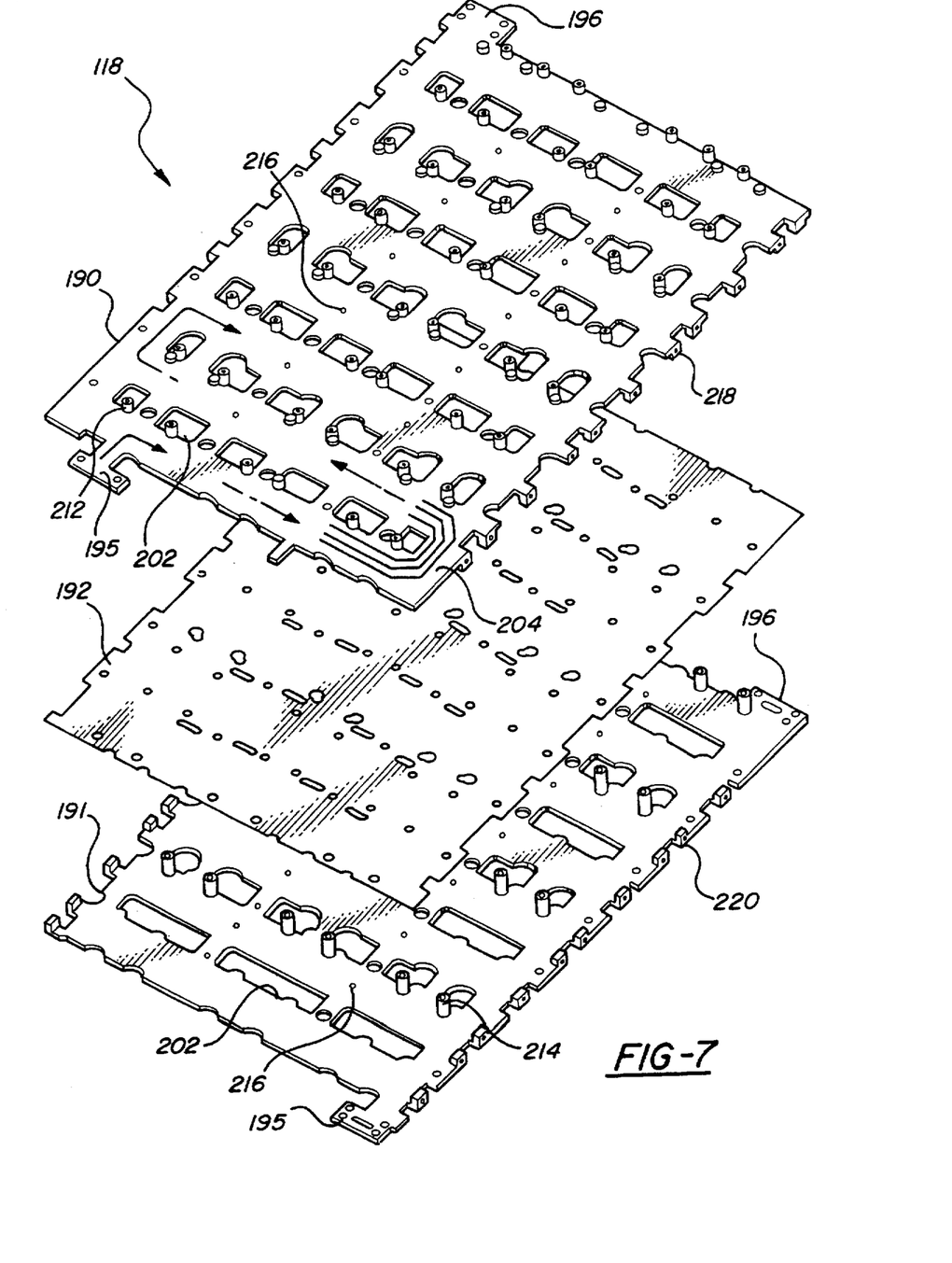
FIG. 7 is an exploded view of the DC bus.
Figure 8:
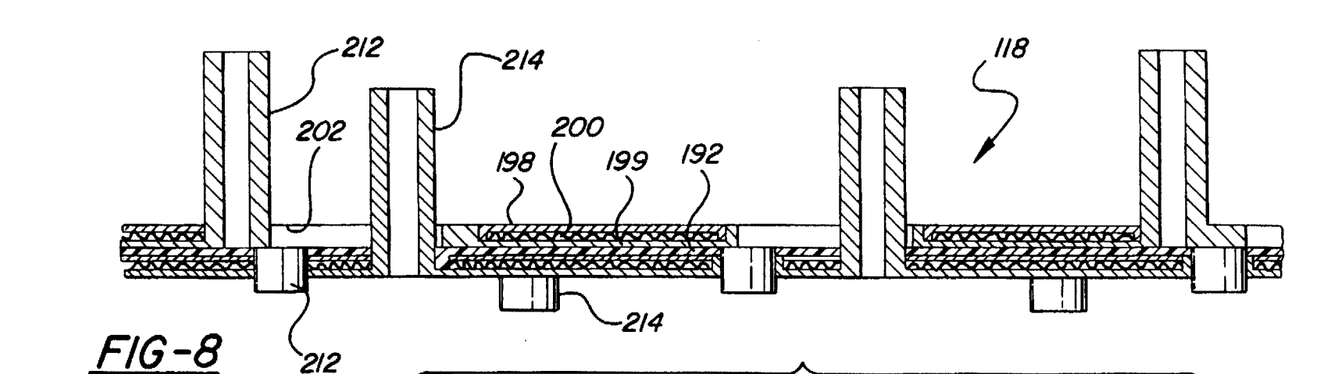
FIG. 8 is a cross sectional view of the assembled DC bus.

Each of the plates 190,191 is formed by first and second conducting sheets 198,199 with a corrugated material 200 therebetween. The sheets 198,199 and corrugated sheet material 200 are brazed sealed to one another forming an enclosed cavity to allow the fluid to pass therethrough. An aluminum material is utilized for each of the sheets 198,199 and corrugated sheet 200. The flow through the plates 190,191 is in a serpentine manner with longitudinal openings 202 in each plate 190,191 separating each channel and change in direction of flow. The corners 204 in serpentine flow pattern are provided by 45° straight channels as illustrated in FIG. 7.

The bus inlets 195,196 are connected to the heat exchanger 130 to receive fluid flow. The heat exchanger 130 includes a pair of elongated fluid openings 206 near the outer corners of the first frame 160 and at the same end as the exchanger inlet 172 to pump coolant to the inlets 195 of the bus plates 190,191 of the upper DC bus 118a. The heat exchanger 130 includes a second pair of elongated openings 208 near the outer corners of the first frame 160 at the end opposite the exchanger inlet 172 to receives the return flow of fluid from the upper DC bus 118a. Similarly, the second frame 170 of the heat exchanger includes pairs of elongated openings 210 for supplying and circulating fluid through the lower DC bus 118b. Therefore, a single fluid inlet and outlet to the heat exchanger 130 provides circulating cooling fluid for both the heat exchanger 130 and the DC bus 118.

The first and second conducting plates 190,191 include a plurality of longitudinal openings 202 extending between the serpentine fluid flow paths. There are provided parallel rows of the openings 202. The DC bus 118 is provided to allow direct contact to the transistor modules 120 on a first side thereof and direct contact to the capacitor banks 116 on the second side thereof. In both cases, both positive and negative side contacts 212,214 must be provided to each of the surfaces, i.e. to each of the capacitors 116 and to each of the transistor modules 120. The openings allow for contacts from one plate to extend through the other plate, and vise versa. Each of the conducting plates 190,191 include a plurality of contact posts 212,214 extending on both first and second sides of the plates 190,191 and perpendicular therewith. The contacts 214 extending on the side of the plates 190,191 adjacent the insulation layer 192 are positioned in the openings 202 of the other of the plates 190,191. Therefore, when viewing a first side of the first conducting plate 190 (See FIG. 7), the plate 190 includes contacts 212 extending outwardly from the surface, and within the openings provided in the plate 190 are extended opposite polarity contact posts 214 through the insulation layer 192 from the second conducting plate 191. The outer surface of the second conducting plate 191 is also similarly oriented with the positive and negative conducting posts 212,214 both extending on one side. The positioning of the contact posts 212,214 depends on the positioning of the transistor modules 120 and the brackets for holding the capacitor banks 116. It can be appreciated that both the positive and negative DC signals are required off both outward surfaces of the DC buses 118a,118b. Both DC buses 118a,118b are similarly formed, with the geometry or positioning of the contact posts 212,214 varying depending on necessary connections.

The plates 190,191 include a plurality of holes 216 formed therein and extending through the buses 118a,118b to be aligned with the connection posts 178 of the cross points on the heat exchanger 130. The heat exchanger 130 and the DC buses 118a,118b are mounted to one another for structural ridgity at these holes by suitable fasteners.

The longitudinal side edges of the DC bus 118, i.e. each of the plates 190,191, include contact pads 218,220 formed therein. The perpendicular contact pads 218,220 are perpendicular to the plane of the DC bus. These contact pads 218,220 allow for interconnection between the two buses 118a,118b, as subsequently discussed.

Figure 9:
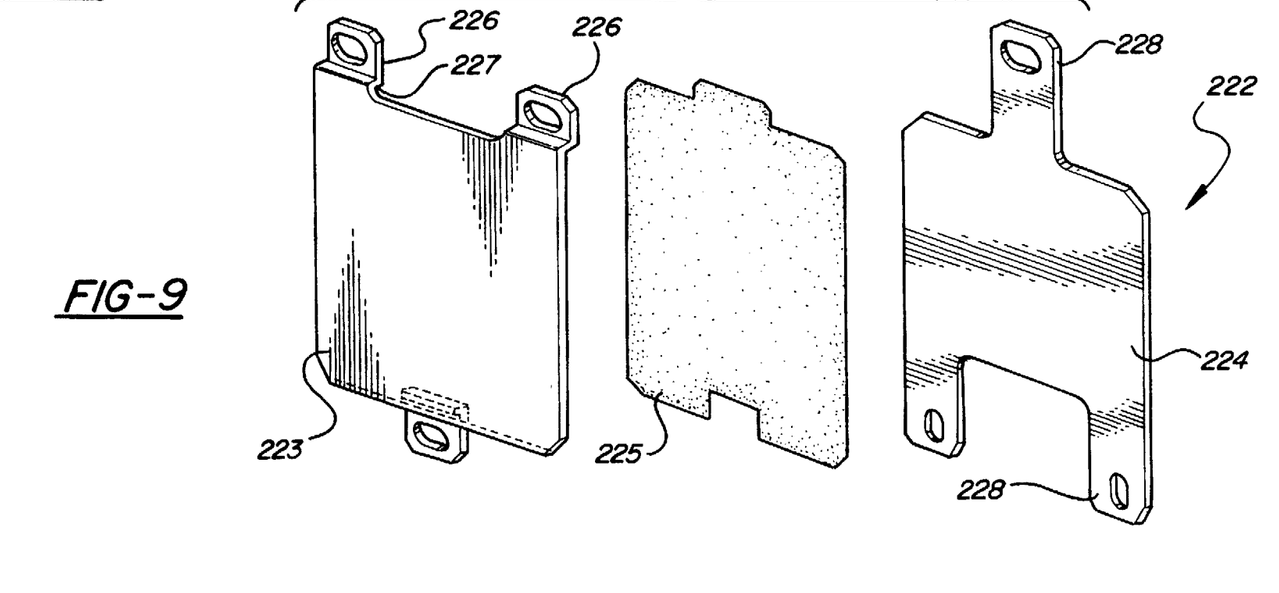
FIG. 9 is an exploded view of the DC cross strap.

The first and second bus members 118a,118b are spaced from one another about the heat exchanger 130. A plurality of conducting strap members 222 interconnect the first and second buses 118a,118b. The conducting strap members 222 include first and second strap plates 223,224 electrically insulated from one another and secured to one another. A first of the strap plates 223 is connected to the positive bus plates 190 and a second of the strap plates 224 is connected to the negative bus plates 191. The strap plates 223,224 are comprised of generally planar, wide thin sheets sandwiched against one another. An insulation sheet 225 of material is provided and laminated between the strap plates 223,224 to isolate the opposite polarity signal on the plates 223,224. The strap plates 223,224 include first and second ends. The first and second ends include planar contact pads 226,228 extending outwardly from each end. The contact pads 226 of the first plate 223 include a shoulder 227 formed therein off set from the plate so that the contact pads 226 of the first and second plates 223,224 are coplanar when assembled. The contact pads 226,228 are fixedly connected to the perpendicular contact pads 218,220 extending from the two bus members 118a,118b. This allows current to flow through the strap members 222 to each of the bus members 118. The strap members 222 are comprised of sheet aluminum material coated on their outer surface by a gold layer to increase conductivity. The strap members 222 are symmetrical.

The bus members 118 and straps 222 are laminated to keep the inductance of the bus system at a minimum. This keeps the voltage spikes during switching low. It also allows a reduction of capacitance required to stabilize the bus 118.

There is provided approximately one half inch clearance between the surface of the heat exchanger 130 and the DC bus 118. Within this space are located various ac bus bars for contacting the transistor modules 120 and directing the output current therefrom to the electric machine 28,32,36 to be driven by the ac signals.

Figure 10:
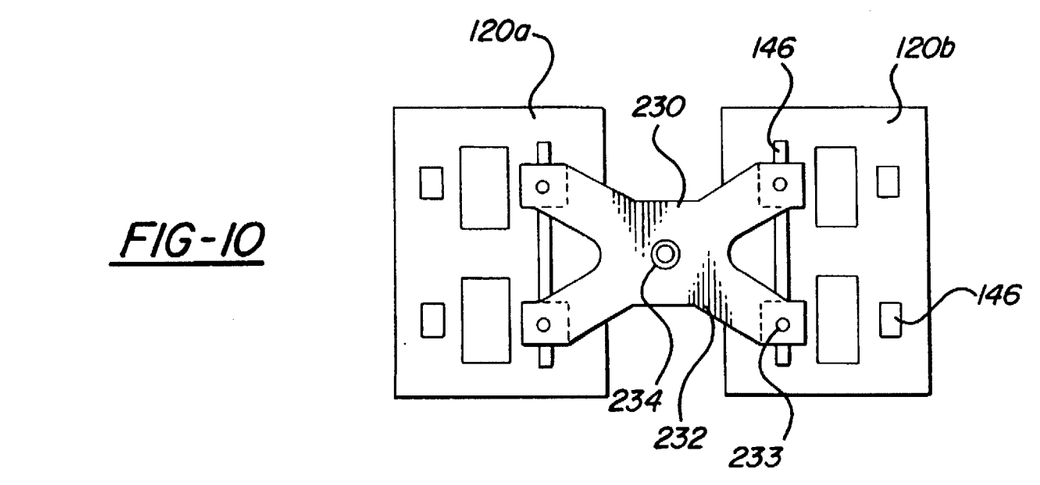
FIG. 10 is a perspective view of the cross ties.

The power unit 112 includes cross ties 230 as illustrated in FIG. 10. The cross ties are comprised of an aluminum sheet of material cut out to have four (4) symmetrical arms 232 extending therefrom with outer ends of the each arm 232 including a mounting aperture 233 and the center point of the cross tie includes a mounting aperture 234. As can be understood, there are two (2) transistor modules 120 which form one third of the H-bridge which drive the induction machines in three phase. As illustrated in FIG. 3, each pair of transistors have a common emitter and collector connected to one another. The cross ties 230 form this interconnection as illustrated. Each of the modules 120 forms ⅙ of the H-bridge and is connected to its pair. For example, all of the collectors of transistor module 120a are connected to all of the emitters of transistor module 120b by the cross tie 230 to provide a single out put at center aperture 234 of one phase of the ac signal. The cross ties 230 are constructed of an aluminum material with gold plating as with the DC strap plates 222.

The turbine alternator requires a single pair of transistor modules 120 for each phase as is illustrated in the drawings, i.e., six transistor modules 120. The flywheel requires two (2) layers of the H-bridge transistors modules 120 for each transistor illustrated in the FIG. 3. Therefore, four (4) transistor modules 120 are used to drive one phase. In the case of the traction motor, there are three (3) transistor modules 120 for each transistor illustrated in FIG. 3. In other word, six (6) transistor modules 120 drive one phase of the traction motor. The amount of transistor modules 120 used is due to current requirements of the machines.

Figure 11:
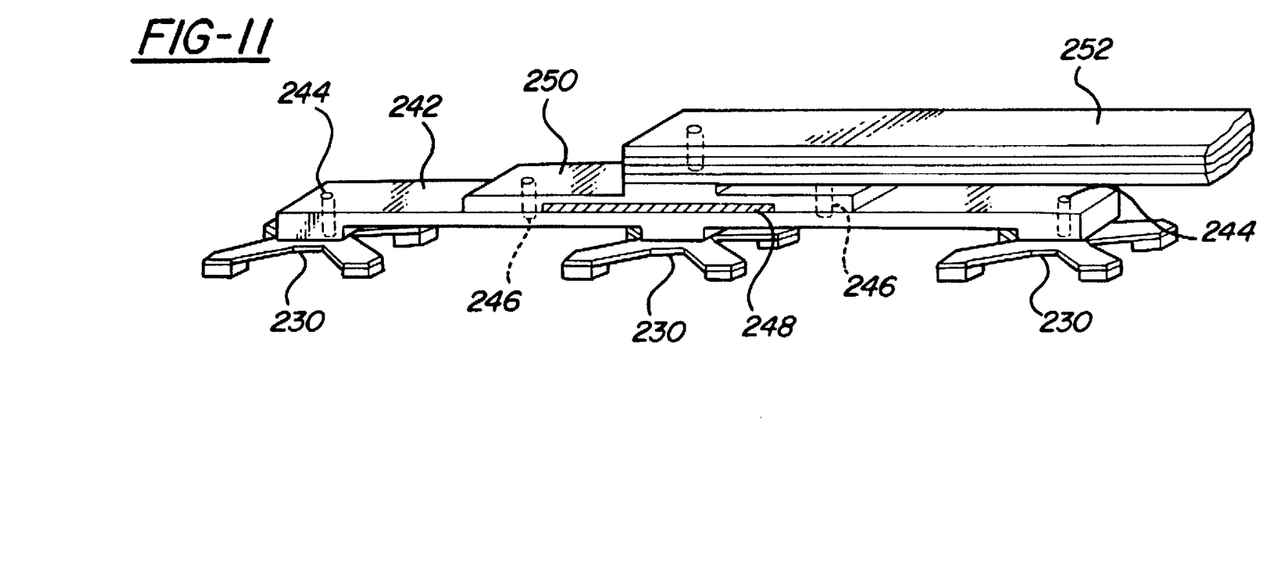
FIG. 11 is a perspective view of the traction motor AC bus.

The ac bus bars include a bus bar assembly for each electric machine 28,32,40. The bus bar assemblies contact the respective cross ties 230 and communicate the ac signals to the respective electric machines 28,32,40. Each bus bar assembly includes one bus bar for each phase of the three phase signal. In the case of the traction motor, since there are three (3) transistor modules for each of those illustrated in the general FIG. 3, there is in effect six (6) transistor modules 120 which produce one phase of the ac signal. Therefore, the traction motor bus bar assembly 240 contacts three (3) cross ties in order to produce one phase of the ac signal to the traction motor 32. This is accomplished by using a pair of connecting plates 242,243. A first plate 242 includes three apertures 244 for connection with three cross ties 230. The first plate 242 includes a pair of center intermediate apertures 246 equally spaced between the three 244. A second plate 243 is electrically insulated from the first plate by an insulation layer 248, except at the intermediate apertures 246 which conduct the signal from the first plate 242 to the second plate 243. The second plate 243 includes a center connecting output aperture 250 to provide the single phase ac signal. A transmitting bus bar 252 connects at the center point 250 of the second plate 243 to connect the signal directly to the traction motor 32. The cross strapping shown in FIG. 11 is to equalize the length of the individual phases.

Figures 12, 13:
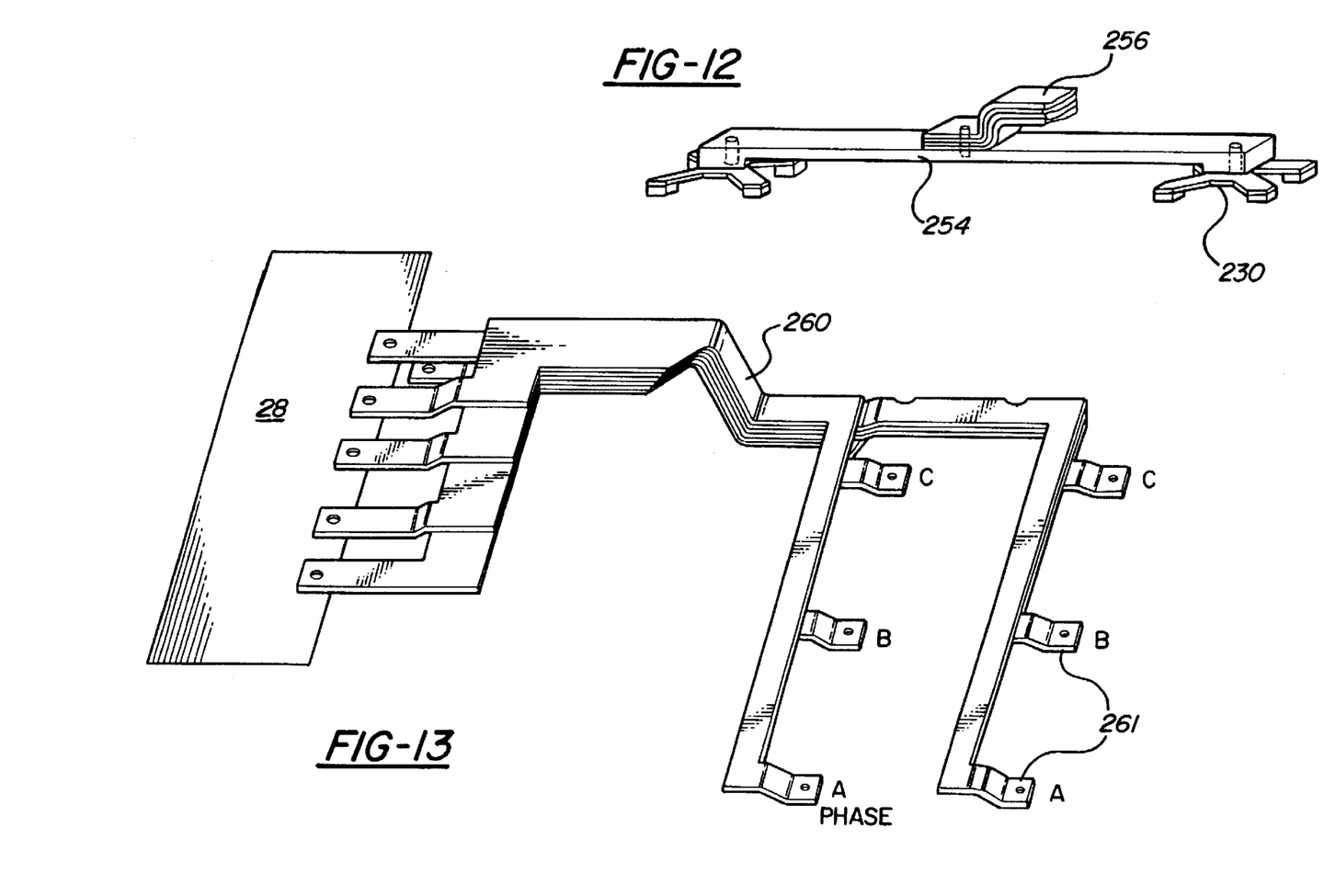
FIG. 12 is a perspective of the flywheel AC bus.
FIG. 13 is a perspective of the turbine alternator AC bus.

In regard to the flywheel, there are two (2) layers of the transistors 120 for each illustrated in the general FIG. 3. Therefore, there are two (2) cross ties 230 which are interconnected by a first layer AC bus bar 254 to provide one phase of the ac signal driving the flywheel 40. A transmitting bus bar 256 connects the first layer bus bar to the flywheel 40.

In the case of the turbine alternator unit 28, the ac bus bar 260 contacts a single cross tie 230 to provide a single phase of AC power. A single bus bar 261 for each phase is used and connected only to a single cross tie 230. Therefore, three bus bars 261 are utilized to drive one of the turbine alternators 28 for a three phase signal.

The intermediate bus bars are comprised of a single bar with geometry to evenly pull signals from each cross tie 230 contact. Each of the transmitting bus bars 252,256,260 are comprised of multi layer sheets of bars stacked on each other (See FIG. 11) and laminated and having the same geometry and distance for each layer to insure symmetry of the signal. In the preferred embodiment, five (5) bars are utilized to provide the AC transmitting bus for a single signal for the flywheel 36 and traction motor 32. This allows 700 Amps to be transmitted. Each of the frequencies at which the AC signal is operated, skin effect occurs whereby the signal is carried on the outside surface of the conductor. Therefore, by using a plurality of sheets of bars, higher signal levels and signal response may be obtained. Each of the bars comprising a bus is laminated together to provide a single unit. The turbine alternator 28 uses single layer of bar.

The geometry of the AC bus bars is dependent upon space requirements within the power unit. In general, it is preferred to optimize width of the bars and shortness in distance to the driver machine.

The capacitor banks 116 are connected on the outer sides of the both of the DC buses 118a,118b, i.e., there are two (2) capacitor banks 116a,116b. Each capacitor 270 is a metallized poly propylene film capacitor with low dissipation factor; each can carry 30 Amps and are 23 mF. The capacitor banks 116 are comprised of a plurality of cylindrically shaped capacitors 270 mounted to a plurality of mounting or L-shaped bracked 272 connected to the DC buses 118a, 118b. The positive and negative contact posts 212,214 extending from the DC bus 118a,118b are connected to the L-shaped brackets 272. The base 273 of the L-shaped bracket is connected to the respective of the DC bus control posts 212,214 wherein the perpendicular extending side includes apertures 274 therein to receive ends of the capacitors 270. A pair of brackets 272 is laminated to each other with an insulation layer 276 therebetween. One of the brackets 272 connects to the negative DC bus plate 191 and the other of the brackets 272 connects to the positive DC bus plate 190. Each capacitor 270 is connected between positive and negative brackets 272. A pair of brackets 272 is connected between rows of capacitors 270 wherein one of the brackets 272 is positive and one of the brackets 272b is negative. On the upper side of the power unit 112 there are connected forty-eight (48) capacitors 270 between multiple pairs of the capacitor brackets 272. On the lower capacitor bank 116b there are connected twenty-four (24) capacitors 270 in a staggered arrangement. In design, the capacitance is made to be maximized with consideration of the space available. Therefore, more capacitors 270 could be used if more space was available.

Connected to the outer sides of the capacitor banks 116a,116b are the gate drivers 128. There is one gate driver 128 for each transistor module 120. The gate driver 128 is comprised of a circuit board 280 with appropriate conductors and circuitry thereon. The gate drivers 128 receive a control signal from the management controller 30 to drive the transistors 114 at the established pulse width modulation to output the ac signals. The gate drivers 128 are positioned in three rows on the outside and a center row within the upper capacitor bank 116a, and on the bottom of the lower capacitor bank 116b. Positioning is merely for compact space requirements and to situate the drivers as close to its respective transistor module 120 as possible. Each of the leads from the gate drivers 128 is approximately three (3) to four (4) inches long and connected to its respective transistor module 120. It is important that the conduction length be equivalent for each gate driver to ensure proper firing of the respective transistor module 120.

The remainder of the space on the heat exchanger absent the windows provides for connection of a 800 to 24 volt DC convertor 500 which is thereby liquid cooled by the heat exchanger 130. In the remaining positions are located three (3) fluid pump electric drives, one for the heat exchanger 130, and the remaining two (2) for the electric machines 28,32,40.

Referring to FIG. 4B, the power unit 112 includes a housing 282 for supporting each of the internal components. The housing 282 is provided as an integrated unit when assembled with the power unit 112 and management controller 30 which may be simply placed as a whole unit in the vehicle 20 and removed therefrom. The housing 282 includes two opposing longitudinal side walls 283,284 having fastening openings 285 extending along the center thereof along the longitudinal length. The fastening openings 285 receives fasteners which are connected to the mounting apertures 179 on the heat exchanger 130. By this method, the heat exchanger 130 and DC 118 and AC buses are connected within the housing 282. The housing 282 also includes an integrally connected end wall 286 providing outputs connections at a first end. A second end wall 287 opposing the first end wall provides additional output and input connections. A divider wall 288 is secured and positioned within the housing 282 to section off a part of the internal housing for the management controller 30 for EMI/RFI protection of the controller 30. Once the heat exchanger 130 and buses and capacitor banks 116 and gate drives 128 are assembled together, the entire unit 112 is place within the housing 282 and secured by the fasteners to the housing 282. Upper and lower walls may be secured thereto to form an enclosed housing 282 which may then be simply placed and removed from the vehicle 20 while making only the external connections. The power density in the housing 282 is maximized to 400 w/inch$^3$. The housing is formed of carbon fiber composite.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A transistor connection assembly comprising:
   a plurality of power transistor modules connected in a plane and each having contact pads formed thereon for providing an output signal;
   a cross tie member connected to four of said contact pads providing a combined output signal at a center point;
   said cross tie member comprising a sheet of rigid conducting material with width substantially greater than thickness and including four symmetrical arms extending outward from said center point to form an X shape.

2. A transistor connection assembly as set forth in claim 1 wherein said cross tie member comprises an aluminum material.

3. A transistor connection assembly as set forth in claim 2 wherein said aluminum material is gold plated.

4. A transistor connection assembly as set forth in claim 1 wherein each of said power transistor modules include a first pair of contact pads connected to an emitter and a second pair of contact pads connected to a collector.

5. A transistor connection assembly as set forth in claim 4 wherein said cross tie member interconnects said contact pads connected to the emitter of a first one of said power transistor modules and said contact pads connected to the collector of a second one of said power transistor modules to produce a single phase signal.

6. A transistor connection assembly as set forth in claim 5 wherein said power transistor modules and cross ties form an H-bridge to provide three phase signal output on three separate of said cross tie members.

7. A transistor connection assembly as set forth in claim 4 wherein said power transistor modules include a pair of contact pads to receive DC power, said cross tie member interconnecting said contact pads on two of said power transistor modules to power.

8. A transistor connection assembly comprising:
   a plurality of power transistor modules connected in a plane and each having contact pads formed thereon for providing an output signal;
   a cross tie member connected to four of said contact pads providing a combined output signal at a center point;
   said cross tie member comprising a sheet of rigid conducting material with width substantially greater than thickness and including four symmetrical arms extending outward from said center point to form an X shape, said center point including a mounting aperture.

9. A transistor connection assembly comprising:
   a plurality of power transistor modules connected in a plane and each having contact pads formed thereon for providing an output signal;
   a cross tie member connected to four of said contact pads providing a combined output signal at a center point;
   said cross tie member comprising a sheet of rigid conducting material with width substantially greater than thickness and including four symmetrical arms extending outward from said center point to form an X shape, said center point and each of said arms including a mounting aperture.

* * * * *